US009628085B1

(12) United States Patent
Kalte et al.

(10) Patent No.: US 9,628,085 B1
(45) Date of Patent: Apr. 18, 2017

(54) METHOD AND DEVICE FOR ACCELERATED ACCESS TO SIGNALS OF A PROGRAMMABLE LOGIC DEVICE

(71) Applicant: dSPACE digital signal processing and control engineering GmbH, Paderborn (DE)

(72) Inventors: Heiko Kalte, Paderborn (DE); Dominik Lubeley, Verl (DE); Lukas Funke, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 15/334,659

(22) Filed: Oct. 26, 2016

(30) Foreign Application Priority Data

Nov. 3, 2015 (DE) .......... 10 2015 118 782
Dec. 4, 2015 (DE) .......... 10 2015 121 128

(51) Int. Cl.
*G11C 7/10* (2006.01)
*H03K 19/177* (2006.01)
*G11C 7/22* (2006.01)

(52) U.S. Cl.
CPC .......... *H03K 19/1776* (2013.01); *G11C 7/10* (2013.01); *G11C 7/222* (2013.01); *H03K 19/17776* (2013.01)

(58) Field of Classification Search
CPC ....... G11C 7/10; G11C 7/222; H03K 19/1776
See application file for complete search history.

(56) References Cited

U.S. PATENT DOCUMENTS 6,665,782 B2 * 12/2003 Capps, Jr. ............... G06F 21/79
711/115
6,907,595 B2 * 6/2005 Curd ................... G06F 15/7867
326/39

(Continued)

FOREIGN PATENT DOCUMENTS

DE 10 2013 101 300 A1 8/2014
WO WO 2011/147443 A1 12/2011
WO WO 2016/049336 A1 3/2016

OTHER PUBLICATIONS

"All Under One Roof," pp. 48-51, dSPACE, Magazine Mar. 2009, dSPACE GmbH, Paderborn, Germany.

(Continued)

*Primary Examiner* — Pho M Luu
(74) *Attorney, Agent, or Firm* — Muncy, Geissler, Olds & Lowe, P.C.

(57) ABSTRACT

A method for accessing signals of a programmable logic device having a functional level and a configuration level at run time when the programmable logic device is executing a predefined configuration. An access to at least one signal value that has a number of bits is requested. The individual bits in the configuration are each located in an address unit with one address offset apiece such that one or more bits of a signal value are located in one address unit. A bitwise access to the requested signal values takes place, wherein the accesses to the individual bits are sorted as a function of the address unit containing the applicable bit in such a manner that the accesses to all bits located in an address unit take place in sequence as a function of the address offset, independently of the signal containing the applicable bit.

10 Claims, 4 Drawing Sheets

(56) References Cited

U.S. PATENT DOCUMENTS

| | | | |
|---|---|---|---|
| 7,271,616 B2 | 9/2007 | Goel et al. | |
| 7,548,091 B1* | 6/2009 | Liu | H03K 19/0016 |
| | | | 326/38 |
| 8,356,272 B2* | 1/2013 | Chene | G06F 17/5027 |
| | | | 716/106 |
| 2004/0113655 A1 | 6/2004 | Curd et al. | |
| 2006/0022700 A1 | 2/2006 | Goel et al. | |

OTHER PUBLICATIONS

"Speed and Flexibility FPGA," pp. 40-43, dSPACE, Magazine Mar. 2009, dSPACE GmbH, Paderborn, Germany.

Paiz et al., "FPGA-in-the-Loop-Simulations for Dynamically Reconfigurable Applications", 1. System and Circuit Tehnology, 2. Product Engineering, University of Paderborn, Germany, pp. 372-375, 2009 IEEE.

* cited by examiner

METHOD AND DEVICE FOR ACCELERATED ACCESS TO SIGNALS OF A PROGRAMMABLE LOGIC DEVICE

This nonprovisional application claims priority under 35 U.S.C. §119(a) to German Patent Application No. 10 2015 118 782.5, which was filed in Germany on Nov. 3, 2015, and German Patent Application No. 10 2015 121 128.9, which was filed in Germany on Dec. 4, 2015, and which are both herein incorporated by reference.

BACKGROUND OF THE INVENTION

Field of the Invention

The invention relates to a method for accelerated access to signals of a programmable logic device at run time, a device for accessing signals of a programmable logic device, and a computer program product.

Description of the Background Art

For the control or simulation of dynamic systems, increasing use is being made of rapid control prototyping systems and hardware-in-the-loop simulators that have one or more programmable logic devices known, for example, Field Programmable Gate Arrays (FPGA) in addition to the microprocessors that are generally present. One example of a simulation of a dynamic system by means of an FPGA is known from the article, "All Under One Roof," pp. 48-51, dSPACE Magazine March 2009, available at www.dspace.com. At its functional level, an FPGA includes a plurality of logic elements and connecting elements, the precise interconnection of which is only defined at initialization by means of a bit stream that is written into the configuration level of the device. The architecture of FPGAs thus allows for good matching to the specific application and parallel processing of signals, so that FPGAs can also reliably simulate or control rapidly changing controlled systems.

The configuration of an FPGA described by the bit stream can be created, with the aid of a block diagram of the system to be modeled, as is described, for example, in the article, "Speed and Flexibility FPGA," pages 40-43, dSPACE Magazine March 2009. This permits convenient operation for the user, but requires a comparatively great expenditure of time due to the intermediate steps required. During analysis of the system or controller, it may frequently be necessary to access certain signals in the model in order to determine the current output value of a block under consideration, for example. In useful fashion, it should thus be possible to access various signal values of an FPGA, without changing the configuration, while it is executing a configuration corresponding to the model. A corresponding method for accessing a signal value of an FPGA at run time is known from DE 10 2013 101 300 A1, which is incorporated herein by reference.

Access to the signal values takes place here through the configuration level of the FPGA, which has a multiplicity of address ranges or address units by means of which memory elements can be addressed. In order to limit the size and complexity of the address logic, the address units of commercial FPGAs include a multiplicity of words or a correspondingly larger number of bits. Even if access to only a single bit is requested, all words from the start of the address unit to the requested bit must be read. Consequently, only a small number of signals can be measured during the simulation of a dynamic system on account of the limited speed of access to the configuration level.

From U.S. Pat. No. 7,271,616 B2 is known an improved circuit arrangement for reducing readback time of an FPGA. However, this circuit requires modifications to the programmable logic device itself, and thus is only available to a manufacturer of applicable devices.

SUMMARY OF THE INVENTION

It is therefore an object of the invention to provide a method and a device that advance the state of the art and preferably make possible an acceleration of access, in particular random access, to signals of a commercial programmable logic device.

A method is thus provided that allows access to signals of a programmable logic device having a functional level and a configuration level at run time when the programmable logic device is executing a predefined configuration, wherein an access to at least one signal value that comprises a number of bits is requested, wherein the individual bits in the configuration are each located in an address unit with one address offset apiece such that one or more bits of a signal value are located in one address unit, wherein an access comprises a reading from and/or a writing to the configuration level. According to an exemplary embodiment of the invention, a bitwise access to the requested signal values takes place, wherein the accesses to the individual bits are sorted as a function of the address unit containing the applicable bit in such a manner that the accesses to all bits located in an address unit take place in sequence as a function of the address offset, independently of the signal containing the applicable bit, wherein accesses with ascending address offset take place later.

When the programmable logic device executes a configuration in which at least one signal is defined that comprises a number of bits, which are each located in an address unit or frame of the configuration level with one bit offset apiece, so that one or more bits of a signal value is or are contained in a frame, access requests for a signal are usefully translated into one or more access requests for bits contained in the signal.

In this context, signals can be understood to mean related bits which in general can be arranged arbitrarily on the programmable logic device so it is not necessary for contiguous addresses to be present at the configuration level. In general, a signal can also be understood to mean an arbitrary value composed of one or more bits that, for example, is stored in one or more registers.

A method according to the invention has the advantage that each address unit (or each frame) need only be read out once. A substantial acceleration of access thus takes place, especially when a number of distributed signals in a large configuration are read. It is not necessary in this context for the configuration to be specifically adapted, so there are no restrictions with regard to optimization of a configuration for maximum execution speed.

An address unit can include a multiplicity of words, wherein read accesses take place in such a manner that the address unit is read out word-by-word, and wherein at least the word currently being read out is temporarily stored in a buffer. If only read access is made to the signals, then in useful fashion only the word currently being read out is temporarily stored in the value buffer, with the result that the value buffer occupies little memory space.

Read accesses to multiple signals can be executed such that the bits of all requested signal values that are contained in the buffer in each case are extracted, and the signal values are assembled from the individual bits of which the applicable signal is composed. A great acceleration can be achieved with little memory space (for the already extracted bits of signals) by this means.

It is advantageous when a write access to at least one signal value takes place in such a manner that first an address unit that includes at least one bit of the signal value to be written is read out, wherein the address unit is read out from beginning to end and temporarily stored in the buffer, that the at least one bit contained in the address unit is then adjusted according to the signal value to be written, that next the contents of the buffer are written to the address unit, and that this process takes place for all address units that contain at least one bit of the signal value to be written. Depending on the architecture of the computer system, this can produce significant accelerations, wherein preferably the method is executed at least in part by a component that is connected to the programmable logic device through an interface with a high transmission speed. The connection between the component and an operator computer requesting the accesses does not have to provide a high transmission speed in this design. In general, a reconfiguration of the programmable logic device could also be accelerated in this way.

In the case when both read accesses and write accesses that relate to the same address unit are requested, it is especially advantageous for them to be executed in such a manner that a readout of the entire address unit takes place first, then all bits are extracted that are included in a signal value that is to be read, and next all bits that are included in a signal value that is to be written are adjusted according to the signal value to be written, whereupon the contents of the buffer are written to the address unit. A joint sorting and nested execution of write and read accesses permits an especially substantial acceleration of the access to signals of a programmable logic device.

The invention additionally relates to a device for accessing signals of a programmable logic device that includes a functional level and a configuration level, wherein the configuration level includes a number of address units through which a multiplicity of memory elements can be accessed, including an interface that can be connected to one or more computing units, and a memory, and an access unit. According to the invention, the device can be configured to receive bit access requests for at least one bit through the interface and to store received bit access requests in the memory, wherein the device is designed in such a manner that the bit access requests stored in the memory can be implemented in a predefined sequence, and wherein the device additionally is configured to sort incoming bit access requests based on the applicable address unit, and furthermore to sort them such that bit access requests for all bits located in a single address unit are stored sequentially in the memory, wherein the access unit implements bit access requests with a higher address offset later.

The memory can be implemented as a FIFO buffer or as a stack, for example. A device according to the invention can be implemented in various ways, for example, it can be implemented on an additional ASIC or CPLD, or can constitute a part of the configuration of the FPGA. A computing unit can be implemented as a microcontroller or as a standard PC, for example. Memory elements that can be part of the configuration level or of the functional level are accessed for reading and/or writing by means of the configuration level.

As a result of the fact that the device is implemented as a standalone component, it is possible to provide accelerated access to the configuration level of the programmable logic device for a multiplicity of computing units. This takes place in a largely transparent manner, with the result that computing units such as microcontrollers or IP cores located on the programmable logic device can access signals in the same manner as standard PCs.

In an embodiment of the invention, the address offset of a bit access request is divided into a word offset that indicates the position of the word containing the bit in the address unit, and a bit position that indicates the position of the bit in the word, wherein the device is configured to sort access requests within an address unit by the word offset and the bit position.

According to an embodiment of the invention, the access unit includes a word loader, a word buffer, and at least one bit selector, wherein a bit access request for reading a bit is implemented in such a manner that the address unit is addressed, and the word loader continues accessing the configuration memory and temporarily storing the currently read word in the word buffer until the word offset of the bit access request is reached, and wherein the value of the requested bit is extracted from the word buffer by means of the at least one bit selector. If multiple bit access requests are present that all have the same word offset, then in advantageous manner only one extraction of the applicable bits with the at least one bit selector is performed. As a result, repeated accesses to the configuration level that would require repeated reading or writing starting from the beginning of the same address unit are avoided. The device can have two or more bit selectors that allow simultaneous or substantially simultaneous readout of multiple bits. A preferred access unit of this nature can be implemented in an especially simple and compact manner so that, for example, it can even be integrated into the configuration of relatively small programmable logic devices.

A device according to the invention can be configured to carry out a partial reconfiguration of the programmable logic device, wherein the changes to be made are stored in the memory as bit access requests, wherein the device has a write buffer that can hold an address unit of the configuration level, wherein each address unit affected by at least one bit access request is first read into the write buffer, then each bit to be changed is adjusted in the address unit, and next the address unit is written to the configuration level. Especially when the data transmission between the operator computer and the device only has a low transmission speed, the reconfiguration of a programmable logic device can be accelerated substantially. Since many commercial FPGAs permit a partial reconfiguration, the device can also be implemented on the programmable logic device itself in this case.

The invention additionally relates to a computer program product having a computer-readable storage medium in which instructions are embedded that, when they are executed by a computing unit, have the effect that the computing unit is configured to carry out a method according to the invention.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
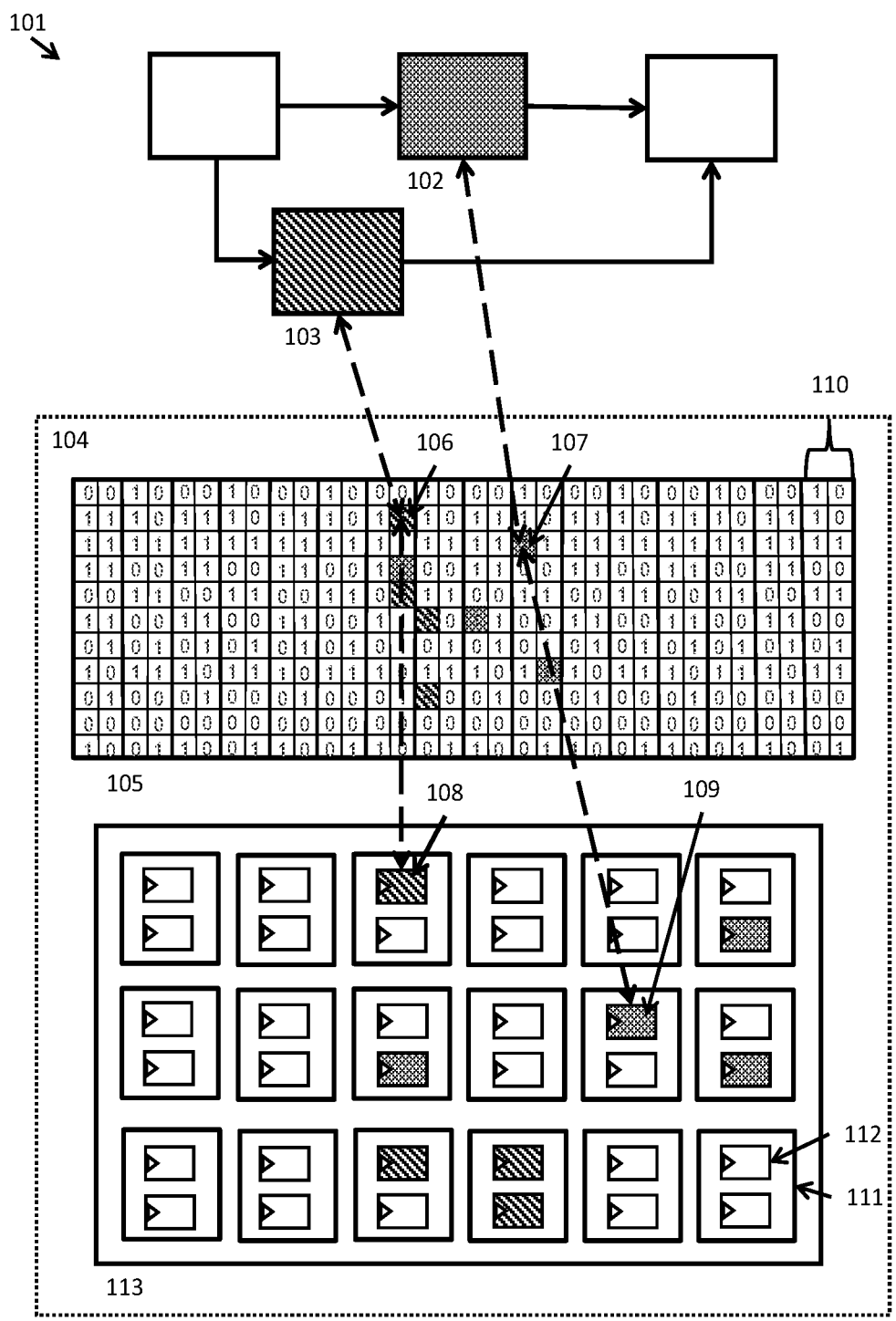
FIG. 1 shows a schematic view of a programmable logic device.

The illustration in FIG. 1 shows a schematic view of a programmable logic device with a configuration created in accordance with a model of a dynamic system, and a block diagram of the model.

The model 101 that is shown for a dynamic system is designed as a block diagram in which the individual blocks, such as block 102 and block 103, perform calculations and pass their output values on to other blocks as is shown with solid arrows. Software programs are known that can convert a model of this nature into executable program code or a configuration for a programmable logic device. The behavior of the dynamic system is simulated, for example by the means that the calculations are repeated cyclically at predetermined time steps such as, e.g., 1 ms, with the output signals of the preceding time step being used as input values for the next time step. Preferably, provision can be made for the output values of a block to each be temporarily stored in a register.

The programmable logic device 104 shown comprises a functional level 113, which contains a multiplicity of logic devices, and a configuration level 105, through which it is possible to access a multiplicity of memory elements. The functional level 113 comprises a plurality of logic elements and connecting elements as well as a clock supply that may comprise multiple clock regions. The logic elements can be, for example, registers, truth tables (also known as lookup tables or LUT), adders, and delay units, but can also be frequency generators. Depending on the granularity of the FPGA device, several of these elements can also be combined into one elementary unit 111 (also known as a configurable logic block). In the example shown, each elementary unit 111 includes two registers 112, which each hold one bit. The connecting elements usefully comprise conductive traces of differing lengths, which for example can also extend across regions of the FPGA, and switchable connections between the conductive traces and logic elements. For reasons of clarity, the illustration does not show other logic elements of the elementary units 111, nor does it show connecting elements.

The configuration level 104 has a multiplicity of memory elements such as registers, which each store one or more bits, for example, for the logic elements and connecting elements. A bit can, for example, describe the state of a switch that brings the logic element into contact with a connecting element. The memory elements of the configuration level 105 are located in a multiplicity of address units 110 that each comprise a large number of bits. Provision can also be made for registers 112 of the functional level 113 to be located in an address unit 110, so that the registers can be accessed through the configuration level 105 without intermediate buffering.

The programmable logic device 104 has at least one configuration interface—not shown—through which it is possible to write to the configuration level 105 or read from the configuration level. For example, once the model 101 has been converted into a configuration and the same has been written to the configuration level 105, a simulation of the dynamic system can be performed. The output signals of the blocks 102 and 103, which are usefully stored in registers, can in this context have multiple bits that are located in different regions of the programmable logic device. Dashed arrows are used in the illustration to represent a correspondence between the output signal of the applicable block, bits at the configuration level, and registers at the functional level. Thus the output signal of block 102 contains the bit stored in register 109 that can be addressed through the address 107, and the output signal of block 103 contains the bit stored in register 108 that can be addressed through the address 106. By accessing the configuration interface during the run time of the programmable logic device 104, the current value of one or more signals can be measured.

Figure 2:
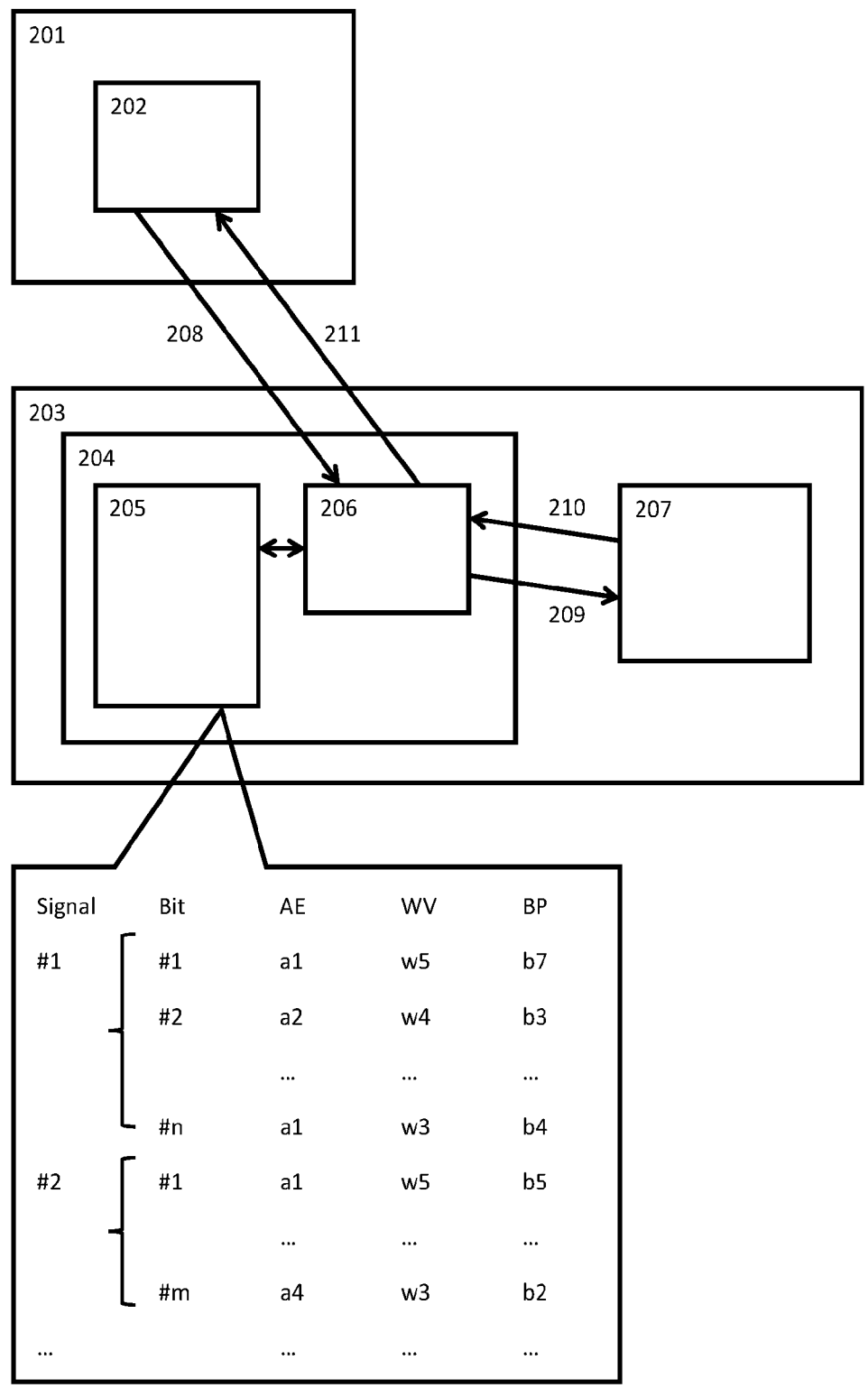
FIG. 2 shows a schematic view of a computer system.

The illustration in FIG. 2 shows a schematic representation of a computer system in which signals of a programmable logic device can be accessed by means of a method according to the invention.

The computer system shown includes an operator computer 201, which can be implemented, for example, as a standard PC, and a real-time computer 203 that includes a computing unit 204 that can be implemented as a microprocessor with one or more cores and a programmable logic device 207.

The operator computer 201 executes a measurement program 202 through which the user can specify the signals to be measured, and can view and store measured signal values.

The real-time computer 203 preferably is designed for the simulation or control of dynamic systems, which is to say in which it is necessary to ensure a defined time behavior with adherence to predefined latency times, and for example, in which new values are calculated cyclically. In general, the model of a dynamic system that is to be calculated can be divided between the computing unit 204 and the programmable logic device 207 in any desired manner. In the current example, the simplifying assumption is made that the model is executed completely on the programmable logic device 207, or that only signals on the programmable logic device 207 are to be measured. Since access to data of a process executed on a microprocessor is known per se, any desired signals can as a general rule also be measured for divided models.

The computing unit 204 executes an acquisition program 206 that receives from the measurement program 202 a list with signals to be measured, as is indicated by the arrow 208. After receiving the list of signals, the acquisition program 206 uses a symbol table 205 to determine which addresses of the configuration contain the signals to be measured. The illustration includes a schematic representation of a symbol table 205 for the example. A signal includes a number of bits, each of which is assigned an address unit AE and an address offset in the configuration. The address offset here is divided into a word offset WV within the address unit and a bit position BP within the word. The acquisition program 206 converts an access request for a signal into access requests for the individual bits contained by the signal. For example, if signal #1 and signal #2 are to be measured, then the acquisition program 206 transmits the corresponding bit access requests 209 to the programmable logic device 207. In useful fashion, the bit access requests 209 are transmitted through a configuration and/or debugging interface so that the programmable logic device 207 can continue to execute the current configuration, and the access consequently takes place at run time.

If signal #1 and signal #2 each contain 4 bits, for example, then a total of 8 bit access requests are transmitted to the programmable logic device 207. As is indicated by way of example in the symbol table shown, it is not necessary for the individual bits of a signal to be arranged sequentially, but instead they can be located in different address ranges and/or word offsets of the configuration. To accelerate access to the configuration level, the acquisition program 206 therefore carries out a re-sorting of the bit access requests 209 before they are transmitted to the programmable logic device. In this process, the hierarchical structure of the measurement request is broken apart, which is to say that the individual bit access requests are sorted solely as a function of the applicable address unit and applicable address offset, independently of the containing signal.

In useful fashion, therefore, sorting first takes place by the address unit in which the requested bit is to be found. Next, access requests for bits located in the same address range are sorted by location in the address range, which is to say by word offset and preferably bit position. In the example shown in FIG. 2, successive numeric values indicate successive address units or word offsets, which is to say that a1 precedes a2. Consequently, after sorting has taken place, the bit access request for bit #1 of signal #2 is transmitted before the bit access request for bit #1 of signal #1, but after the bit access request for bit #n of signal #1.

The programmable logic device 207 receives the bit access requests and reads the regions of the configuration level where requested bits are located. The values 210 of the individual bits are usefully transmitted to the acquisition program 206 in the order of the received bit access requests. Using the symbol table 205, the acquisition program 206 assembles the requested signals from the individual bits and transmits the signal values 211 to the measurement program 202. Especially when multiple bits of different signals are located in one address range, the sorting according to the invention of the bit access requests permits a substantial acceleration of access. Consequently, a multiplicity of variables can be measured simultaneously.

Instead of or in addition to a measuring of signals, provision can also be made for an alteration of individual signals to be requested through the measurement program 202, for which purpose it is thus necessary to write to the configuration level, which likewise can be accomplished through a configuration interface. The coarse addressability of the configuration level in this context requires that a complete address unit be written in each case, even if only one bit is to be changed. For this reason, it is advantageous for write accesses to be carried out in such a way that a read access to the address unit takes place first, and the address unit is temporarily stored in a buffer. Next, the desired change to one or more bits of this address unit is carried out and the temporarily stored and modified address unit is written to the configuration level. A process of this nature can also be called a read-modify-write access.

In the event that both read and write accesses are requested for at least one address unit, the address unit is first usefully read into a buffer, the bits requested in a read access are extracted, then the bits to be changed in a write access are modified and the changed buffer content is written to the configuration level. A sorting according to the invention of the individual bit access requests can thus usefully take place jointly for read and write accesses.

The list below shows an example for requests concerning the reading of signals:
R [S #1; B #1]: AE: a1; WV: w1; BP: b1
R [S #1; B #2]: AE: a2; WV: w2; BP: b2
R [S #1; B #3]: AE: a3; WV: w3; BP: b3
R [S #1; B #4]: AE: a4; WV: w4; BP: b4
R [S #2; B #1]: AE: a5; WV: w5; BP: b5
R [S #2; B #2]: AE: a2; WV: w6; BP: b6
R [S #2; B #3]: AE: a7; WV: w7; BP: b7
R [S #2; B #4]: AE: a8; WV: w8; BP: b8

A read R of signals #1 and #2 is thus requested, each of which includes 4 bits whose position in each case is specified by an address unit AE, a word offset WV in the address unit, and a bit position BP in the corresponding word.

It is assumed in the present example that a writing of the signals specified in the list below is to take place in the same time unit:
W [S #3; B #1]: AE: a9; WV: w9; BP: b9
W [S #3; B #2]: AE: a2; WV: w10; BP: b10
W [S #3; B #3]: AE: a11; WV: w11; BP: b11
W [S #3; B #4]: AE: a12; WV: w12; BP: b12

In other words, a writing W of signal #3, which includes 4 bits, is requested.

In useful fashion, the read and write requests are sorted into a shared list in such a manner that the reading of the corresponding address unit required for the read-modify-write access directly returns the bits required for the read accesses. In the present example, the access requests are thus sorted as shown in the list below:
R [S #1; B #1]: AE: a1; WV: w1; BP: b1
W fS #3; B #2]: AE: a2; WV: w10; BP: b10
R fS #1; B #2]: AE: a2; WV: w2; BP: b2
R fS #2; B #2]: AE: a2; WV: w6; BP: b6
R [S #1; B #3]: AE: a3; WV: w3; BP: b3
R [S #1; B #4]: AE: a4; WV: w4; BP: b4
R [S #2; B #1]: AE: a5; WV: w5; BP: b5
R [S #2; B #3]: AE: a7; WV: w7; BP: b7
R [S #2; B #4]: AE: a8; WV: w8; BP: b8
W [S #3; B #1]: AE: a9; WV: w9; BP: b9
W [S #3; B #4]: AE: a12; WV: w12; BP: b12

Because the underlined access requests all relate to the same address unit a2, it is only necessary to read out this address unit once, with the result that multiple read operations at the configuration level of the programmable logic device can be eliminated.

In the example described above, the programmable logic device was part of a real-time computer that likewise included one or more computing units. In general, provision can alternatively be made to connect an operator computer having a measurement program directly to a programmable logic device, wherein the conversion of signal access requests into multiple bit access requests is then performed by the operator computer, for which purpose the measurement program usefully includes a symbol table. According to another alternative exemplary embodiment, provision can be made to perform the sorting of access requests by means of a dedicated device that, for example, has an external interface through which one or more additional computing units can transmit access requests for signals of the connected programmable logic device.

Figure 3:
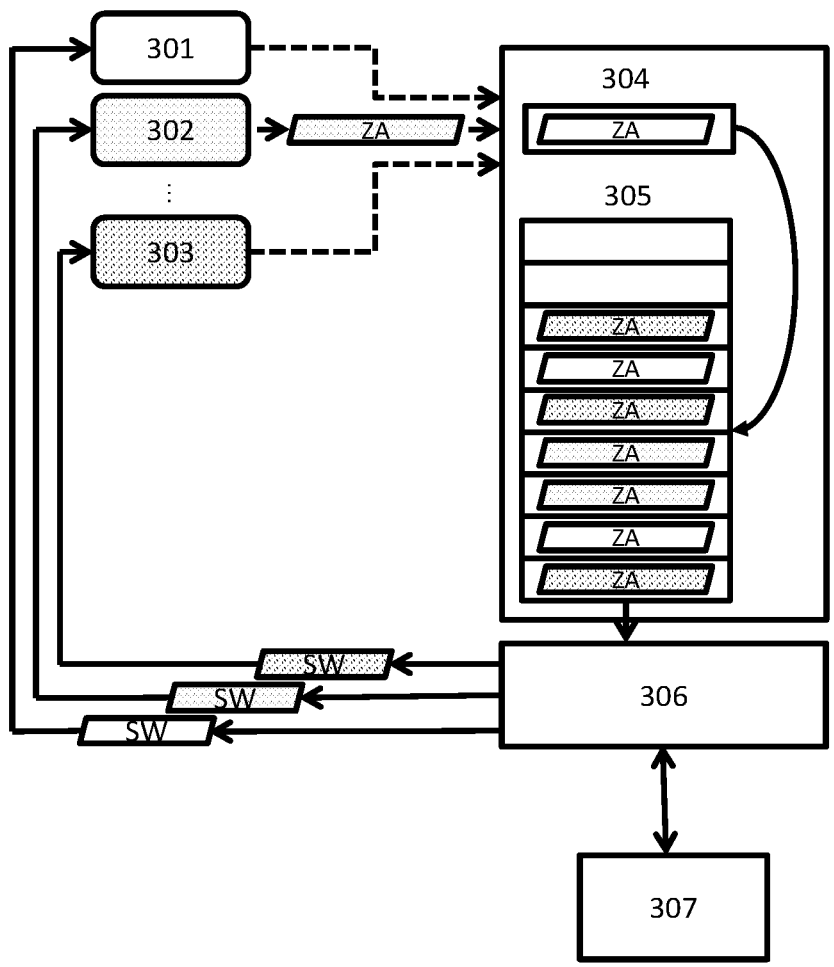
FIG. 3 shows a schematic view of a device according to the invention that is connected to multiple computing units.

The illustration in FIG. 3 schematically shows an exemplary embodiment of a device according to the invention that is connected to multiple computing units.

Computing units 301, 302, and 303 are connected to the device through one or more interfaces, and transmit access requests ZA in order to read and/or write signals of a programmable logic device through its configuration level 307. The device includes a request sorter 304 that receives the access requests and stores them in a buffer 305 sorted by address unit and address offset. The buffer 305 is organized such that the entries are read out, and hence implemented, sequentially based on their location. For example, the buffer can be implemented as a FIFO memory in which the lowest access request is executed next, as shown in the illustration.

The next access request to be executed is delivered to an access unit 306 that can access the configuration level 307 of the connected programmable logic device through an access interface. The access unit 306 extracts the desired signal values SW or writes the desired changes to the applicable address unit. Since the access requests are sorted, each address unit only need be read out once, which in particular makes it possible to avoid repeated transmission of the data located between the beginning of the address unit and a bit requested in a read access. As a result of the shared sorting of read and write requests explained above, the measuring and changing of signals can be further accelerated.

Preferably, a cyclic receiving of the requests, sorting, and storing in the buffer take place, whereupon the accesses are executed and any return values are transmitted. A measurement cycle can be triggered by an internal counter of the device, or can be requested by one of the computing units.

After the implementation of the access requests, the desired signal values are transmitted sequentially by the access unit 306 through the external interface to the requesting computing unit. The computing units can be, for example, standard PCs, microcontrollers, or even an IP core arranged on a region of the programmable logic device itself.

As a general rule, provision can also be made to design the device such that it can receive and implement access requests not for individual bits, but instead for signals having multiple bits. To this end, the device need only be augmented by additional memory and a symbol table so that signal requests are converted into bit requests prior to sorting. After the bit requests have been implemented, they can then be assembled into the desired signal values with the aid of the symbol table.

A device according to the invention permits transparent acceleration of access to the configuration level of a programmable logic device for a multiplicity of instruction sources.

Figure 4:
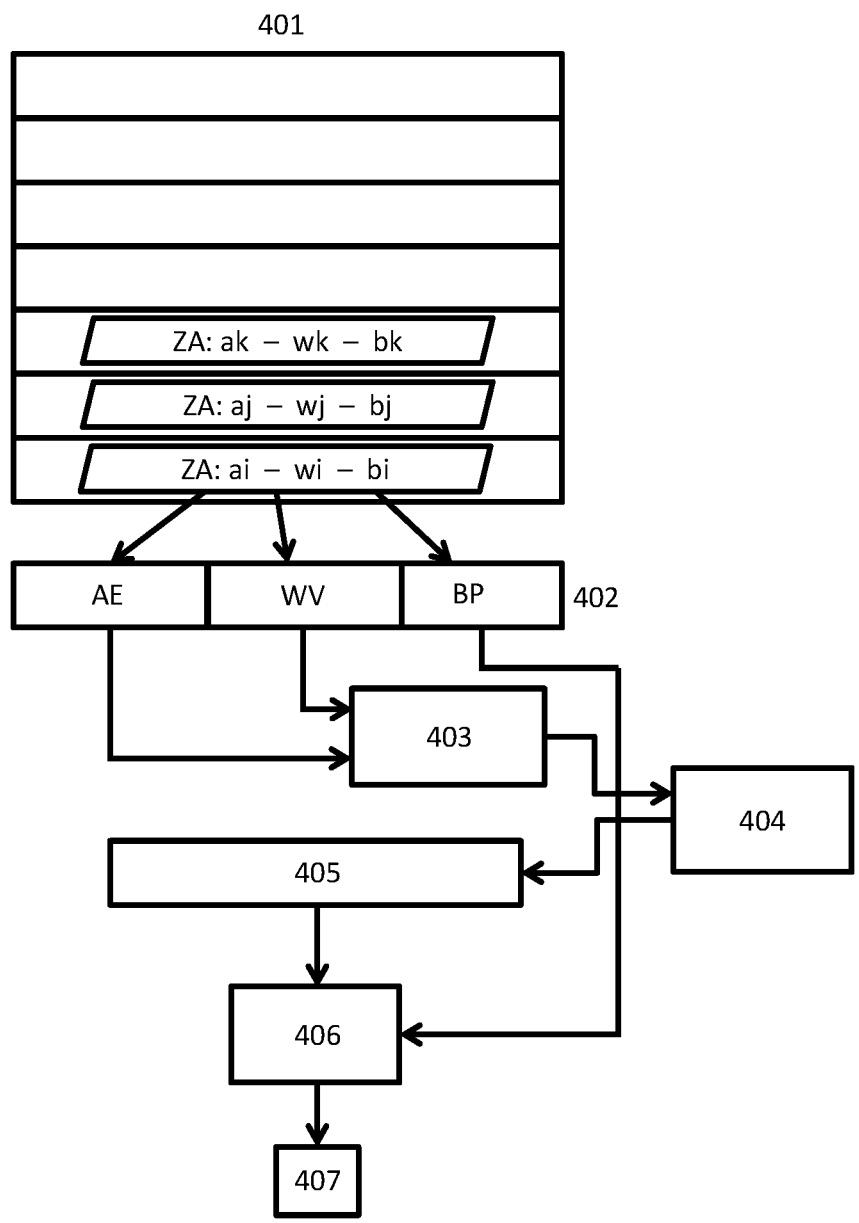
FIG. 4 shows a schematic view of an exemplary embodiment of an access unit according to the invention.

For the case in which all instruction sources or computing units, or measurement programs executed thereby, transmit exclusively access requests to read individual bits, an especially compact and simple embodiment of an access unit according to the invention can be used that is shown schematically in the illustration in FIG. 4.

The memory-optimized implementation of an access unit shown in the illustration takes the next bit read request ZA that is to be executed from a buffer 401, which can be implemented as, e.g., a FIFO memory. The individual bit read requests ZA are already sorted by address unit and address offset so that, for example, ai<=aj.

The address of the current request is loaded into address register 402. Address unit AE and word offset WV are delivered to word loader 403, which—if the previously requested bit was not located in the same address unit AE—selects the address unit AE and continues reading words from the configuration level 404 of the programmable logic device until the desired word offset is reached. Now the word buffer 405 contains the word that includes the requested bit. By means of bit selector 406, the bit located at the desired bit position BP is extracted and the value 407 that is obtained is output. If a word contains 32 bits, for example, the bit selector 406 can be implemented, for example, as a 32 to 1 demultiplexer.

Then the address of the next request is loaded into address register 402. If address unit AE and word offset WV remain the same, word loader 403 can remain inactive, so that only bit selector 406 must extract and output the requested value.

An exemplary access unit of this nature only needs to have one buffer for a single word, and can thus be integrated into the configuration of even small programmable logic devices.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for accessing signals of a programmable logic device having a functional level and a configuration level at run time when the programmable logic device is executing a predefined configuration, the method comprising:

requesting an access to at least one signal value that comprises a number of bits, wherein the individual bits in the configuration are each located in an address unit with one address offset apiece such that one or more bits of a signal value are located in one address unit, wherein the access comprises a reading from and/or a writing to the configuration level;

performing a bitwise access to the requested signal values; and sorting the accesses to the individual bits as a function of the address unit containing the applicable bit such that the accesses to all bits located in an address unit take place in sequence as a function of the address offset, independently of the signal containing the applicable bit, wherein accesses with ascending address offset take place later.

2. The method according to claim 1, wherein an address unit includes a plurality of words, and wherein read accesses take place such that the address unit is read out word-by-word, and wherein at least the word currently being read out is temporarily stored in a buffer.

3. The method according to claim 2, wherein read accesses to multiple signals are executed such that the bits of all requested signal values that are contained in the buffer in each case are extracted, and wherein the signal values are assembled from the individual bits of which the applicable signal is composed.

4. The method according to claim 2, wherein a write access to at least one signal value takes place such that first an address unit that includes at least one bit of the signal value to be written is read out, wherein the address unit is read out from beginning to end and temporarily stored in the buffer, wherein the at least one bit contained in the address unit is then adjusted according to the signal value to be written, wherein the contents of the buffer are then written to the address unit, and wherein this process takes place for all address units that contain at least one bit of the signal value to be written.

5. The method according to claim 4, wherein, in the case when both read accesses and write accesses that relate to the same address unit are requested, they are executed such that a readout of the entire address unit takes place first, then all bits are extracted that are included in a signal value that is to be read, and all bits that are included in a signal value that is to be written are adjusted according to the signal value to be written, and wherein the contents of the buffer are written to the address unit.

6. A computer program product comprising a computer-readable storage medium, in which instructions are embedded that, when they are executed by a computing unit, have the effect that the computing unit is configured to carry out the method according to claim 1.

7. A device for accessing signals of a programmable logic device that includes a functional level and a configuration level, wherein the configuration level includes a number of address units through which a plurality of memory elements are accessed, the device comprising:
- an interface that is connectable to one or more computing units;
- a memory; and
- an access unit,
- wherein the device is configured to receive bit access requests for at least one bit through the interface and to store received bit access requests in the memory,
- wherein the device is configured such that the bit access requests stored in the memory are implemented in a predefined sequence,
- wherein the device additionally is configured to sort incoming bit access requests based on the applicable address unit and to sort them such that bit access requests for all bits located in a single address unit are stored sequentially in the memory, and
- wherein the access unit implements bit access requests with a higher address offset later.

8. The device according to claim 7, wherein the address offset of a bit access request is divided into a word offset that indicates the position of the word containing the bit in the address unit, and a bit position that indicates the position of the bit in the word, and wherein the device is configured to sort access requests within an address unit by the word offset and the bit position.

9. The device according to claim 8, wherein the access unit includes a word loader, a word buffer, and at least one bit selector, wherein a bit access request for reading a bit is implemented such that the address unit is addressed, and the word loader continues accessing the configuration memory and temporarily storing the currently read word in the word buffer until the word offset of the bit access request is reached, and wherein the value of the requested bit is extracted from the word buffer via the at least one bit selector.

10. The device according to claim 7, wherein the device is configured to carry out a partial reconfiguration of the programmable logic device, wherein the changes to be made are stored in the memory as bit access requests, wherein the device has a write buffer that holds an address unit of the configuration level, wherein each address unit affected by at least one bit access request is first read into the write buffer, then each bit to be changed is adjusted in the address unit, and wherein the address unit is written to the configuration level.

* * * * *